United States Patent
Wendt

(10) Patent No.: US 6,707,306 B1
(45) Date of Patent: Mar. 16, 2004

(54) MEASURING METHOD FOR A CAPACITIVE MEASURING SYSTEM

(75) Inventor: Christoph Wendt, Trier (DE)

(73) Assignee: I.E.E. International Electronics & Engineering S.a r.l., Luxembourg (LU)

( * ) Notice: Subject to any disclaimer, the term of this patent is extended or adjusted under 35 U.S.C. 154(b) by 0 days.

(21) Appl. No.: 09/890,686

(22) PCT Filed: Feb. 8, 2000

(86) PCT No.: PCT/EP00/00984

§ 371 (c)(1),
(2), (4) Date: Aug. 3, 2001

(87) PCT Pub. No.: WO00/48010

PCT Pub. Date: Aug. 17, 2000

(30) Foreign Application Priority Data

Feb. 8, 1999 (LU) ................................................ 90347

(51) Int. Cl.[7] ............................................. G01R 27/26
(52) U.S. Cl. ....................................... 324/662; 324/658
(58) Field of Search ........................ 73/514.16, 514.32; 324/439, 607, 662, 684, 686

(56) References Cited

U.S. PATENT DOCUMENTS

| 4,339,709 A | 7/1982 | Brihier |
| 4,780,662 A | 10/1988 | Bennett et al. |
| 5,021,740 A | * 6/1991 | Sarr et al. .................... 324/687 |
| 6,014,602 A | * 1/2000 | Kithil et al. ................... 701/45 |
| 6,066,954 A | * 5/2000 | Gershenfeld ................ 324/671 |
| 6,275,146 B1 | * 8/2001 | Kithil et al. ............. 340/425.5 |

FOREIGN PATENT DOCUMENTS

EP    0838697 A2    4/1998

* cited by examiner

*Primary Examiner*—N. Le
*Assistant Examiner*—Walter Benson
(74) *Attorney, Agent, or Firm*—McCormick, Paulding & Huber LLP

(57) ABSTRACT

The capacitive coupling of at least two electrodes with an electrically conductive body may be determined when an AC voltage is applied to each of the electrodes and the currents flowing from each of the electrodes are measured. The currents flowing from each of the electrodes are measured n times, when $n \geq 2$, while different AC voltages are applied to the electrodes for each of the measurements. The coupling capacitances are calculated in a network analysis using the respective current and voltage values of the n measurements.

5 Claims, 1 Drawing Sheet

Measurement 1

Measurement 2

MEASURING METHOD FOR A CAPACITIVE MEASURING SYSTEM

FIELD OF THE INVENTION

This invention concerns a capacitive measurement system with several electrodes, that determines characteristic properties of a conductive body, such as shape and position, by means of capacitive coupling between each pair of these electrodes across the electrically conductive body. To this end an ac voltage is applied to each of the electrodes, and the currents flowing from the electrodes are measured. The respective coupling capacitances can then be calculated from the values for the measurement voltages and electrode currents.

BACKGROUND OF THE INVENTION

Such a measurement system is described in LU-A-88 828 for instance. This measurement system comprises at least one transmit electrode and at least one receive electrode that are capacitively coupled by a conductive body. The receive electrodes are connected to an analysis circuit that determines the capacitive coupling of the transmit antenna with the conductive body by comparing the measured signal with a reference signal.

When measuring the capacitive coupling using an earthed measurement instrument, the capacitance of the conductive body with respect to ground constitutes an error source. Patent application LU 88 828 proposes dc isolation of the circuit to remove this error. Here the signal from the transmit electrode is isolated from the system ground to reduce the effect of the parasitic capacitance between ground and the body being detected. This type of isolation is however relatively expensive and can only be integrated in semiconductor technology with difficulty.

SUMMARY OF THE INVENTION

The object of this invention is to present a capacitive measurement method resp. a capacitive measurement system of said type, that works without dc isolation of the individual components from ground.

This objective is met by a method for determining the capacitive coupling of at least two electrodes with an electrically conductive body, wherein an ac voltage is applied to each of the electrodes, and the currents flowing from each of the electrodes are measured. According to the invention the currents flowing from each of the electrodes are measured n times, $n \geq 2$, wherein different ac voltages are applied to the electrodes for each of the measurements, and the coupling capacitances are calculated in a network analysis using the respective current and voltage values obtained in the n measurements.

Making multiple measurements with different measurement voltages enables an equation system to be set up using network analysis that can be resolved into the different capacitances (coupling capacitances and parasitic capacitances). Determining the coupling capacitances of two electrodes by taking two measurements with different measurement voltages results from Kirchhoff's laws in an equation system with 6 equations, for example, from which the coupling capacitances of interest and the parasitic capacitances as well as the parasitic currents flowing through these can be calculated. By this means it is possible to calculate each of the coupling capacitances exactly.

Consequently, unlike the state of the art, in this method it is unnecessary to exclude the parasitic capacitance between the body and ground either by technical means or instrumentation. The parasitic capacitance can remain, but by making multiple measurements of the measured variables they can be properly taken into account in the calculation of the coupling capacitances of interest, and are therefore not incorporated in the capacitance values of interest. This means that the values of interest can be determined extremely accurately. Furthermore, in a measurement apparatus working according to said method, the technical complexity required to provide dc isolation between the component and ground is no longer necessary.

Apart from the accuracy of the voltage sources and the current measurement, the error susceptibility of the calculated values depends on the coupling capacitances, in particular the ratio of the capacitances to each other. In order to optimise the measurement accuracy it is therefore advantageous that the ac voltages applied to each of the electrodes in the (i+1)-th measurement are dependent on the results of the i-th measurement, where $1 \leq i \leq n-1$. The measurement voltages for the second measurement of the currents flowing via the electrodes is advantageously set according to this embodiment in such a way, for instance, that the sensitivity of the second measurement is optimum with respect to the capacitance values found from the first measurement.

In order to further increase the accuracy of determining the coupling capacitances it is advantageous to perform more than two measurements, i.e. $n>2$, and additionally to use statistical methods to analyse the coupling capacitances calculated from the network analysis.

BRIEF DESCRIPTION OF THE DRAWINGS

An embodiment of the invention is now described below from the attached diagrams.

DETAILED DESCRIPTION OF THE PREFERRED EMBODIMENT

Figure 1:
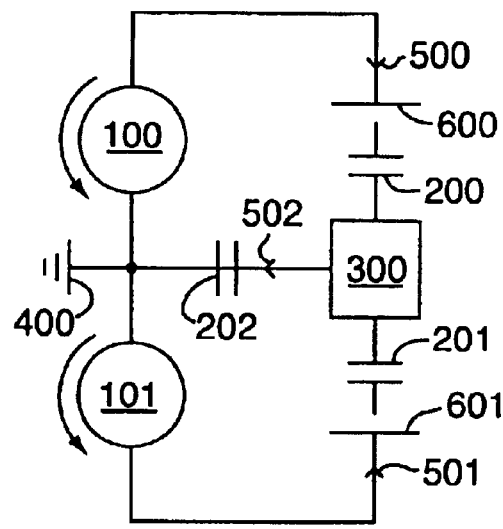
FIG. 1: shows the equivalent network on which the measurement is based.

FIG. 1 shows the equivalent network on which the measurement is based. The capacitances to be determined are the coupling capacitances 200, 201 between the measurement electrodes 600, 601 and a body 300 brought into the electric field, as well as the coupling capacitance 202 between the body 300 and ground 400. The ac measurement voltages 100, 101 applied to the measurement electrodes 600, 601 have the same frequency and phase, and cause a current 500, 501 set by the measurement electronics to flow in the electrodes. In the process a part of each electrode current flows into the other electrode, the rest 502 flowing via the coupling capacitance 202 to ground 400. If two measurements are performed with different measurement voltages then the coupling capacitances 200, 201, 202 can be calculated using network analysis. For this to be possible, the applied measurement voltages must not be a linear combination of each other.

Figure 2:
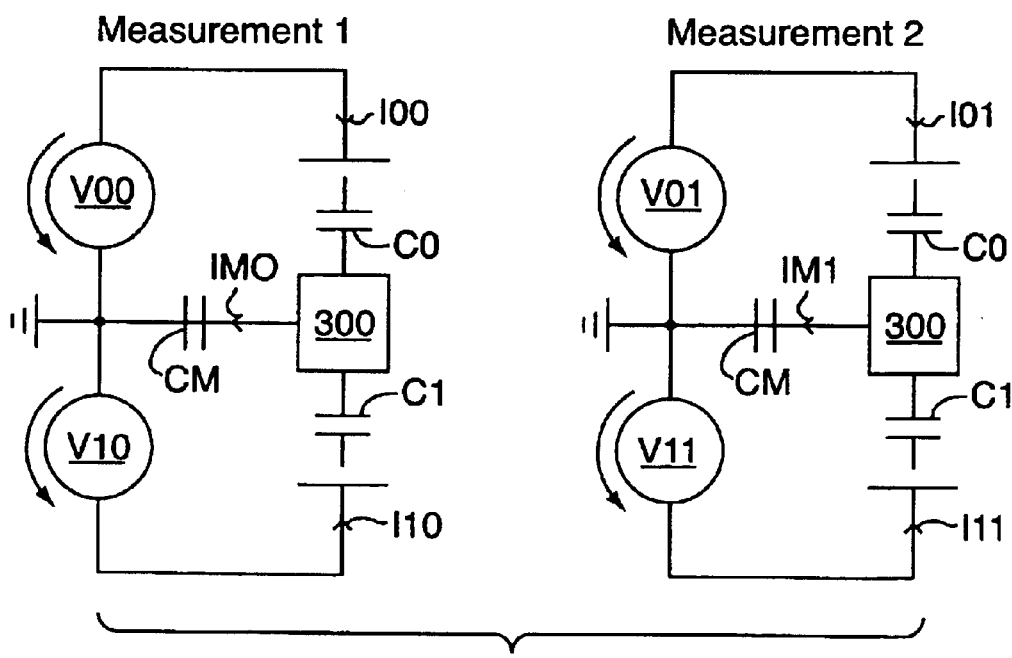
FIG. 2: shows a schematic diagram of two consecutive measurements.

In order to determine the capacitances C0, C1 and CM, two measurements with different measurement voltages must be performed (FIG. 2). The first measurement is performed with voltages V00 and V10. The currents I00 and I01 are measured in this case. In the second measurement with the sensor voltages V01 and V11 one obtains the sensor currents I01 and I11. Firstly an equation system is set up using Kirchhoff's voltage and current laws, where f is the measurement frequency:

$$0 = -V00 + I00 * \frac{1}{2*\pi*f*C0} + IM0 * \frac{1}{2*\pi*f*CM}$$

$$0 = -V01 + I01 * \frac{1}{2*\pi*f*C0} + IM1 * \frac{1}{2*\pi*f*CM}$$

$$0 = -V10 - IM0 * \frac{1}{2*\pi*f*CM} - I10 * \frac{1}{2*\pi*f*C1}$$

$$0 = -V11 - IM1 * \frac{1}{2*\pi*f*CM} - I11 * \frac{1}{2*\pi*f*C1}$$

The equation system is then resolved into C0, C1 and CM to obtain the coupling capacitances:

$$C0 = -\frac{1}{2\pi} \frac{I01*I10 - I00*I11}{f(V00*I11 - V01*I00 + I01*V00 - I10*V01)}$$

$$C1 = -\frac{1}{2\pi} \frac{I01*I10 - I00*I11}{f(-V10*I01 + I00*V11 + V11*I10 - I11*V10)}$$

$$CM = -\frac{1}{2\pi} \frac{I01*I10 - I00*I11}{f(I01*V00 - V01*I00)}$$

Apart from the accuracy of the voltage sources and the current measurement, the error susceptibility of the calculated values depends on the coupling capacitances, in particular the ratio of the capacitances to each other. In order to optimise the measurement accuracy it is therefore advantageous to make the measurement voltages of the 2nd measurement dependent on the result of the 1st measurement.

In order to further reduce the error susceptibility of the values determined for the coupling capacitances, measurements can be performed with more than two measurement voltage configurations, and statistical methods employed to back up the calculated coupling capacitance values.

What is claimed is:

1. A method for determining the capacitive coupling of at least two electrodes with an electrically conductive body, said method comprising the steps of:

applying an AC voltage to each of said electrodes;

measuring the currents flowing from each of said electrodes n times, $n \geq 2$, wherein different AC voltages are applied to said electrodes for each of said n measurements;

setting said AC voltage applied to each of said electrodes in an (i+1)-th measurement in dependence upon a result of an i-th measurement, $1 \leq i \leq n-1$; and utilizing said measured currents and voltage values of said n measurements in a network analysis to calculate said capacitive coupling.

2. The method for determining the capacitive coupling of at least two electrodes with an electrically conductive body according to claim 1, said method further comprising the steps of:

utilizing statistical methods to analyse said capacitive coupling as calaculated from said network analysis.

3. The method for determining the capacitive coupling of at least two electrodes with an electrically conductive body according to claim 1, said method further comprising the steps of:

utilizing statistical methods to analyse said capacitive coupling as calaculated from said network analysis.

4. The method for determining the capacitive coupling of at least two electrodes with an electrically conductive body according to claim 1, said method further comprising the steps of:

determining one of a shape and a position of said conductive body in dependence upon said calculated capacitive coupling.

5. The method for determining the capacitive coupling of at least two electrodes with an electrically conductive body according to claim 1, said method further comprising the steps of:

determining a position of a passenger in a vehicle in dependence upon said calculated capacitive coupling, wherein said passenger is said conductive body.

* * * * *

UNITED STATES PATENT AND TRADEMARK OFFICE
CERTIFICATE OF CORRECTION

PATENT NO. : 6,707,306 B1
DATED : March 16, 2004
INVENTOR(S) : Christoph Wendt

It is certified that error appears in the above-identified patent and that said Letters Patent is hereby corrected as shown below:

<u>Title page,</u>
Item [57] ABSTRACT,
Line 6, after "when", please delete "$n \geqq 2$" and insert -- $n \geq 2$ -- .

<u>Column 4,</u>
Line 2, after "times,", please delete "$n \leqq 2$" insert -- $n \geq 2$ -- .

Line 7, after "measurement,", please delete "$1 \leqq i \leqq n-1$" insert -- $1 \leq i \leq n-1$ -- .

Signed and Sealed this

Twenty-ninth Day of June, 2004

JON W. DUDAS
*Acting Director of the United States Patent and Trademark Office*